United States Patent
Nikolayenkov et al.

(10) Patent No.: US 10,826,437 B2
(45) Date of Patent: Nov. 3, 2020

(54) AMPLIFIER POWER COMBINER WITH SLOTLINE IMPEDANCE TRANSFORMER

(71) Applicant: NXP USA, Inc., Austin, TX (US)

(72) Inventors: Oleksandr Nikolayenkov, Toulouse (FR); Geoffrey Tucker, Tempe, AZ (US)

(73) Assignee: NXP USA, Inc., Austin, TX (US)

(*) Notice: Subject to any disclaimer, the term of this patent is extended or adjusted under 35 U.S.C. 154(b) by 70 days.

(21) Appl. No.: 16/145,809

(22) Filed: Sep. 28, 2018

(65) Prior Publication Data

US 2019/0115875 A1 Apr. 18, 2019

(30) Foreign Application Priority Data

Oct. 18, 2017 (EP) .................................. 17306411

(51) Int. Cl.
*H03F 1/30* (2006.01)
*H03F 3/21* (2006.01)
(Continued)

(52) U.S. Cl.
CPC ............... *H03F 1/30* (2013.01); *H01P 3/023* (2013.01); *H01P 3/081* (2013.01); *H01P 5/18* (2013.01);
(Continued)

(58) Field of Classification Search
CPC . H03F 1/30; H03F 3/189; H03F 3/602; H03F 1/0288; H03F 3/19; H03F 3/211;
(Continued)

(56) References Cited

U.S. PATENT DOCUMENTS 8,384,482 B2  2/2013  Wilson et al.
9,071,211 B1  6/2015  Ozard
(Continued)

FOREIGN PATENT DOCUMENTS

| JP | S61179607 A | 8/1986 |
|---|---|---|
| JP | 09246817 A * | 9/1997 |
| KR | 101631690 B1 | 6/2016 |
| WO | 9815064 A1 | 4/1998 |
| WO | 2015106349 A1 | 7/2015 |

OTHER PUBLICATIONS

Camarchia, V. et al. "The Doherty Power Amplifier: Review of Recent Solutions and Trends", IEEE Transactions on Microwave Theory and Techniques, vol. 63, No. 2, pp. 559-571 (Feb. 2015).
(Continued)

*Primary Examiner* — Robert J Pascal
*Assistant Examiner* — Kimberly E Glenn
(74) *Attorney, Agent, or Firm* — Sherry W. Schumm

(57) ABSTRACT

Systems and methods for communicating electromagnetic signals and/or power and, more particularly for example, to power combiners and similar systems and methods for communicating electromagnetic signals and/or power generated by amplifiers to loads, are described herein. In at least example embodiment, a power amplifier system includes first and second amplifier circuits and a power combiner circuit coupled to each of the first and second amplifier circuits and having a first microstrip transmission line component, a slotline formation, and an additional coupling component that is capable of being at least indirectly coupled to a load, where the first microstrip transmission line component and additional coupling component are electromagnetically coupled by way of the slotline formation.

20 Claims, 5 Drawing Sheets

(51) Int. Cl.
  *H03F 3/19* (2006.01)
  *H03F 1/02* (2006.01)
  *H05K 1/02* (2006.01)
  *H01P 3/08* (2006.01)
  *H01P 3/02* (2006.01)
  *H01P 5/18* (2006.01)
  *H03F 3/60* (2006.01)
  *H03F 3/189* (2006.01)

(52) U.S. Cl.
  CPC ........... *H03F 1/0288* (2013.01); *H03F 3/189* (2013.01); *H03F 3/19* (2013.01); *H03F 3/211* (2013.01); *H03F 3/602* (2013.01); *H05K 1/0243* (2013.01); *H03F 2200/447* (2013.01); *H03F 2200/451* (2013.01); *H03F 2200/543* (2013.01)

(58) Field of Classification Search
  CPC ......... H03F 2200/543; H03F 2200/451; H03F 2200/447; H01P 5/18; H01P 3/023; H01P 3/081; H05K 1/0243
  See application file for complete search history.

(56) References Cited

U.S. PATENT DOCUMENTS

| | | |
|---|---|---|
| 2005/0083122 A1 | 4/2005 | Tayrani et al. |
| 2009/0102578 A1 | 4/2009 | U-Yen et al. |
| 2011/0169590 A1 | 7/2011 | Namerikawa et al. |
| 2011/0187453 A1* | 8/2011 | Deckman .............. H03F 1/0294 330/149 |
| 2015/0200631 A1 | 7/2015 | Outaleb |
| 2016/0049910 A1 | 2/2016 | Datta et al. |

OTHER PUBLICATIONS

Rastogi, A. K. et al. "Design and Performance of Microstrip-To-Slotline Transition", 3rd International Conference on Microwave and Millimiter Wave Technology Proceedings, Beijing, China, pp. 1037-1039 (2002).

Mariani, E.A. et al. "Slot Line Characteristics", IEEE Transactions on Microwave Theory and Techniques, vol. MTT-17, No. 12, pp. 1091-1096 (Dec. 1969).

Abadi, M. N. A. et al. "An extended bandwidth Doherty power amplifier using a novel output combiner", IEEE MTT-S International Microwave Symposium (IMS2014), Tampa, FL, 4 pgs. (2014).

Shuppert, B. "Microstrip/slotline transitions: modeling and experimental investigation", IEEE Transactions on Microwave Theory and Techniques, vol. 36, No. 8, pp. 1272-1282, (Aug. 1988).

U-yen, K. et al. "Slotline Stepped Circular Rings for Low-Loss Microstrip-to-Slotline Transitions", IEEE Microwave and Wireless Components Letters, vol. 17, No. 2, pp. 100-102 (Feb. 2007).

Sahan, N. et al. "Designing an Octave-Bandwidth Doherty Amplifier Using a Novel Power Combination Method", Progress in Electromagnetics Research B, vol. 56, pp. 327-346 (2013).

Norhudah Seman and Marek E. Bialkowski (2010). Microstrip-Slot Transition and Its Applications in Multilayer Microwave Circuits, Passive Microwave Components and Antennas, Vitaliy Zhurbenko (Ed.), ISBN: 978-953-307-083-4, InTech, Available from: http://www.intechopen.com/books/passive-microwave-components-and-antennas/microstrip-slot-transition-and-its-applications-in-multilayer-mircowave-circuits.

Zinieris, M. M. et al. "A Broadband Microstrip-to-Slot-Line Transition", Microwave and Optical Technology Letters / vol. 18, No. 5, pp. 339-342 (Aug. 5, 1998).

Kanade, T. K. et al. "Design and Fabrication of Microstrip to Slotline Transition Bandpass Filter", International Journal of Engineering Research & Technology (IJERT), vol. 4, issue 01, pp. 58-61 (Jan. 2015).

U-yen, K. et al. "A Compact Low-loss Magic-T using Microstrip-Slotline Transitions", IEEE/MTT-S International Microwave Symposium, Honolulu, HI, pp. 37-40 (2007).

Cao, Z. et al. "Fundamental wave phase-locked dual-band push-push DRO using out-of-phase Wilkinson power combiner", Electronics Letters, vol. 46, No. 8, pp. 572-573 (Apr. 15, 2010).

Gupta, K. C., et al., "Microstrip Lines and Slot Lines", Artech House Inc. Washington, pgs. title page, publication data page, v-xi, 269-277, 302-313, 326 (1996).

* cited by examiner

FIG. 1 - PRIOR ART -

AMPLIFIER POWER COMBINER WITH SLOTLINE IMPEDANCE TRANSFORMER

CROSS-REFERENCE TO RELATED APPLICATION

This application claims priority under 35 USC 119(b) to EP application number 17306411.4, filed on Oct. 18, 2017.

FIELD OF THE DISCLOSURE

The present disclosure relates to systems and methods for communicating electromagnetic signals and/or power and, more particularly for example, to power combiners and similar systems and methods for communicating electromagnetic signals and/or power generated by amplifiers to loads.

BACKGROUND OF THE DISCLOSURE

Doherty amplifier circuits employ pairs or groups of amplifier circuit sections (e.g., carrier and peak amplifier circuit sections) that produce signals that ultimately are combined into output signals of the amplifier circuits by way of power combiner sections of the amplifier circuits. In many conventional arrangements, such power combiner sections take the form of microstrip transmission lines that are connected to the amplifier circuit sections of the amplifier circuits by way of DC (direct current) blocking capacitors. The microstrip transmission lines serve to connect the amplifier circuit sections with one another and also with output terminals of the amplifier circuits, to which can be coupled loads.

For example, FIG. 1 shows an example conventional two-way Doherty amplifier circuit 100 that is a Doherty power amplifier circuit and that includes a power combiner section 102, by which the Doherty amplifier circuit 100 is coupled to a load $R_L$ 104 (which can be, for example, 50 ohms). More particularly as shown, the Doherty amplifier circuit 100 includes a carrier amplifier circuit section 106 and a peaking amplifier circuit section 108. The carrier amplifier circuit section 106 includes a transistor section 110 and an output matching section 112. The output matching section 112 has a quarter wavelength DC feeder line that is coupled to a drain power supply voltage $V_{DS}$ 130, and also is coupled to the power combiner section 102 by way of a DC blocking capacitor $C_{DCB}$ 114. The output matching section 112 additionally is coupled to ground by way of each of a radio frequency (RF) capacitor $C_{RF}$ 116, which serves to terminate RF frequencies, and a low frequency capacitor $C_{LF}$ 118, which is for baseband frequencies termination.

Similarly, the peaking amplifier circuit section 108 includes a transistor section 120 and an output matching section 122. The output matching section 122 has a quarter wavelength DC feeder line that is coupled to the drain power supply voltage $V_{DS}$ 130 and also is coupled to the power combiner section 102 by way of a DC blocking capacitor $C_{DCB}$ 124. The output matching section 122 additionally is coupled to ground by way of each of an RF capacitor $C_{RF}$ 126, which serves to terminate RF frequencies, and a low frequency capacitor $C_{LF}$ 128, which is for baseband frequencies termination. Each of the output matching section 112 and the output matching section 122 can take the form of a microstrip transmission line.

More particularly with respect to the power combiner section 102, that section of the Doherty amplifier circuit 100 includes a T-shaped microstrip transmission line 132. First and second branches 134 and 136, respectively, of the T-shaped microstrip transmission line 132 are coupled, respectively, to the DC blocking capacitor $C_{DCB}$ 114 and the DC blocking capacitor $C_{DCB}$ 124, respectively, and link up with one another at a combining node 138 of the T-shaped microstrip transmission line 132. It will be noticed that each of the first and second branches 134 and 136, in addition to having a respective main portion 135 that extends outward away from the combining node 138 up to a respective far end 137, also includes a respective bent portion 139 (or tab) extending perpendicularly from the respective far end 137 of the respective main portion 135 away from the combining node 138, and it is the bent portions that are respectively coupled to the DC blocking capacitors $C_{DCB}$ 114 and $C_{DCB}$ 124, respectively. The first branch 134 can be considered to form an impedance inverter, and the second branch 136 can be considered to form a peaking state off offset (or peaking offset line). A trunk portion 140 of the T-shaped microstrip transmission line 132 in turn extends from the combining node 138 to an output port 142 of the Doherty amplifier circuit 100, to which the load $R_L$ 104 is coupled. The trunk portion 140 of the T-shaped microstrip transmission line 132 in particular is a quarter wavelength microstrip transmission line (or transmission line segment) that serves as an impedance transformer of the power combiner section 102.

By virtue of the DC blocking capacitors $C_{DCB}$ 114 and 124, the T-shaped microstrip transmission line 132 (and correspondingly the output port 142 and the load $R_L$ 104) are galvanically isolated from the drain power supply voltage $V_{DS}$ 130. However, the DC blocking capacitors $C_{DCB}$ 114 and 124, which are respectively located at the outputs of the carrier amplifier circuit section 106 and the peaking amplifier circuit section 108, typically operate in a high temperature harsh environment due to their proximity to the radiated heat areas of the transistor sections 110 and 120, respectively, and typically dissipate some RF power. Not only does this impact the reliability of the Doherty amplifier circuit 100, but also the DC blocking capacitors $C_{DCB}$ 114 and 124 have an undesirable influence on RF bandwidth due to their frequency-dependent admittances and self-resonances, and on production yield due to performance variation.

For at least these reasons, therefore, it would be advantageous if new or improved Doherty amplifier circuits, or power combiner circuit portions within such amplifier circuits, or other circuits, systems, or methods, could be developed that would overcome or address one or more of the above-described concerns or other concerns associated with conventional Doherty amplifier circuits or similar circuits, systems, or methods, or that would achieve one or more other goals or objectives.

Figure 2:
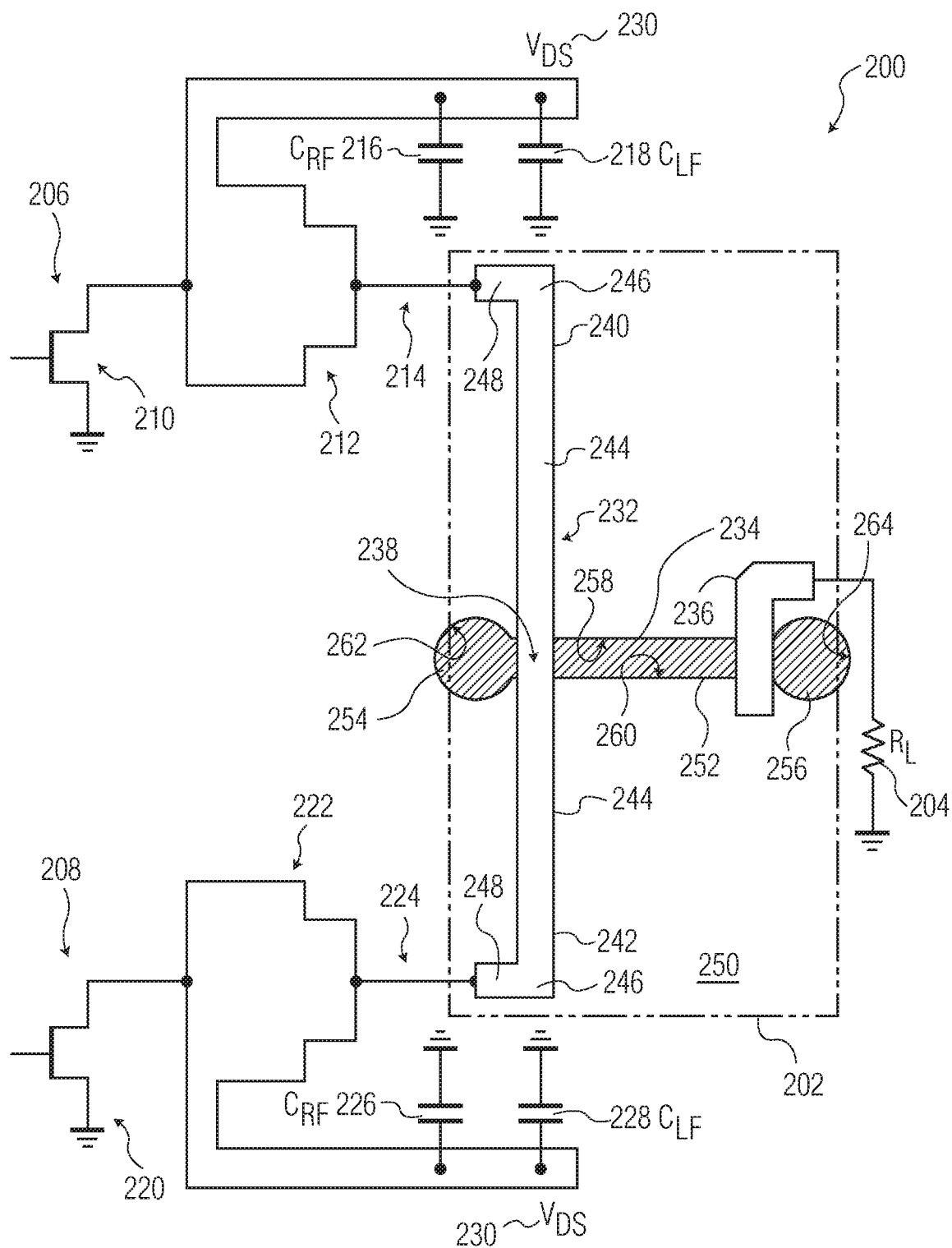
FIG. 2 is a schematic diagram showing an improved Doherty amplifier circuit employing a power combiner section with a slotline formation, in accordance with one example embodiment encompassed herein.
Figure 3:
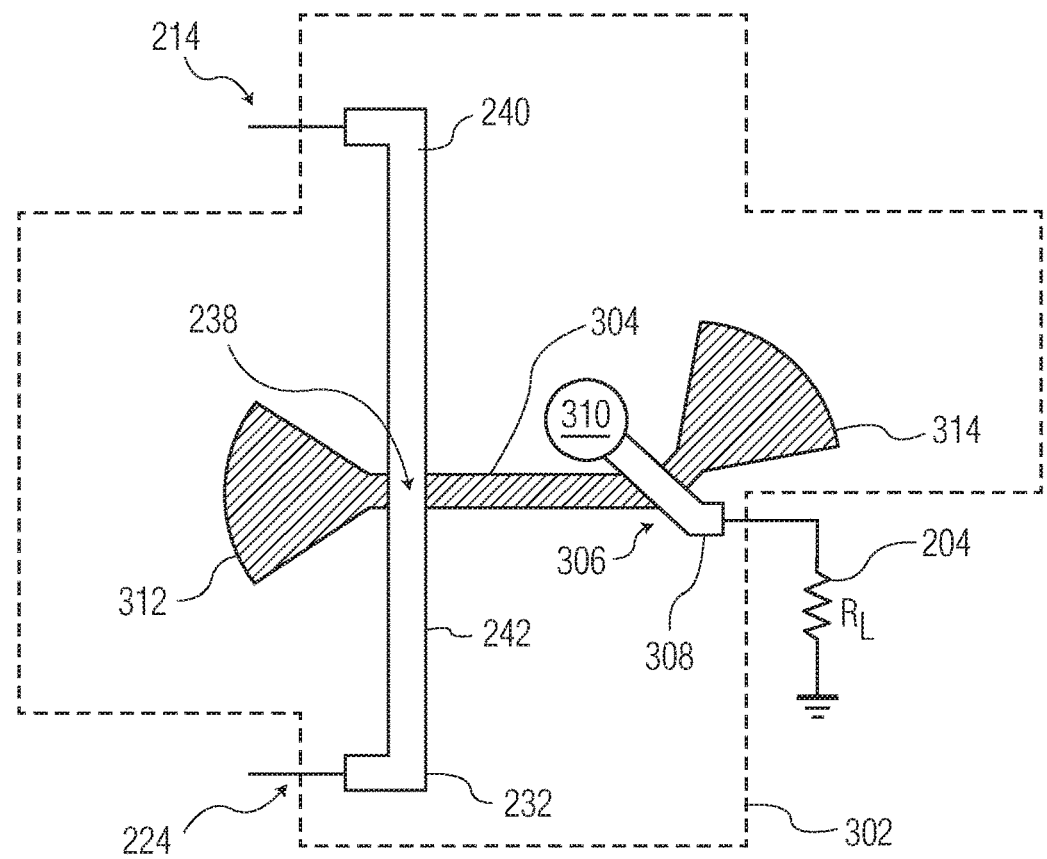
FIG. 3 is a schematic diagram showing another improved Doherty amplifier circuit employing a power combiner section with a slotline formation, in accordance with an additional example embodiment encompassed herein.
Figure 5:
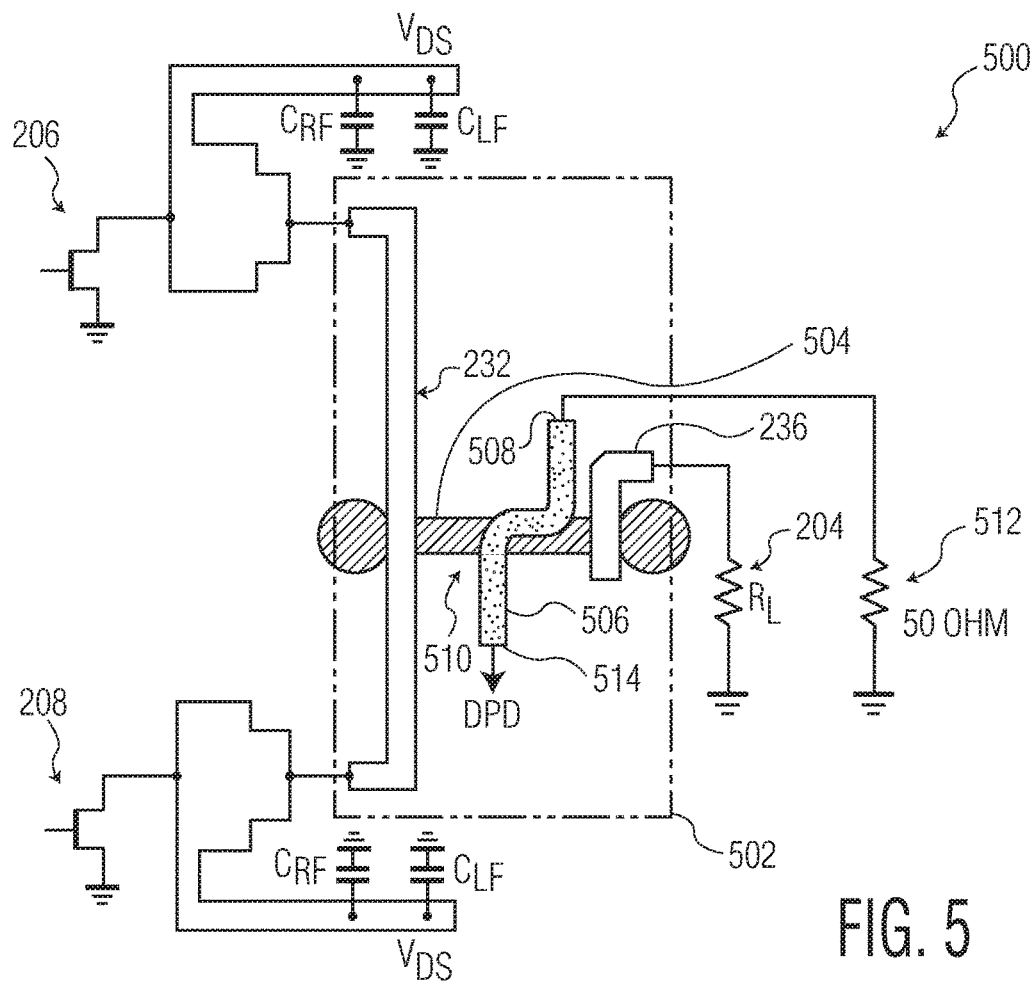
Figure 6:
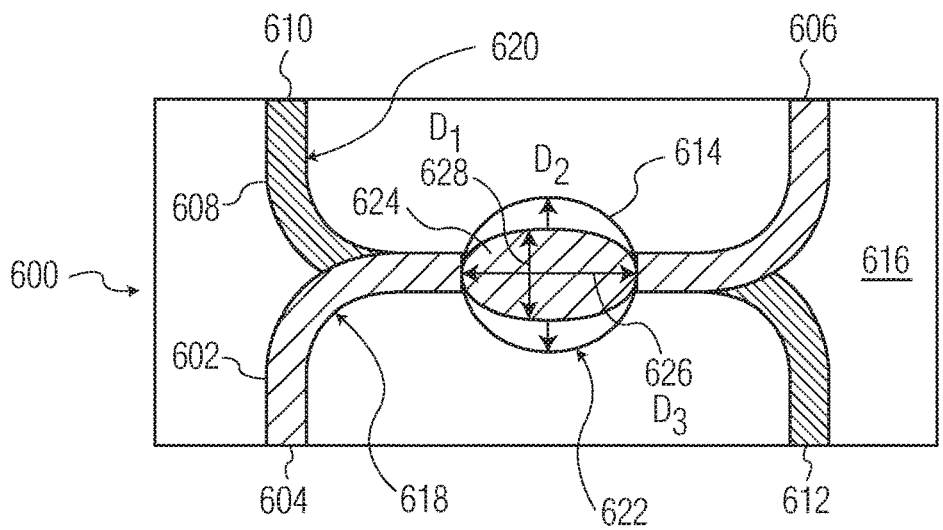
Figure 7:
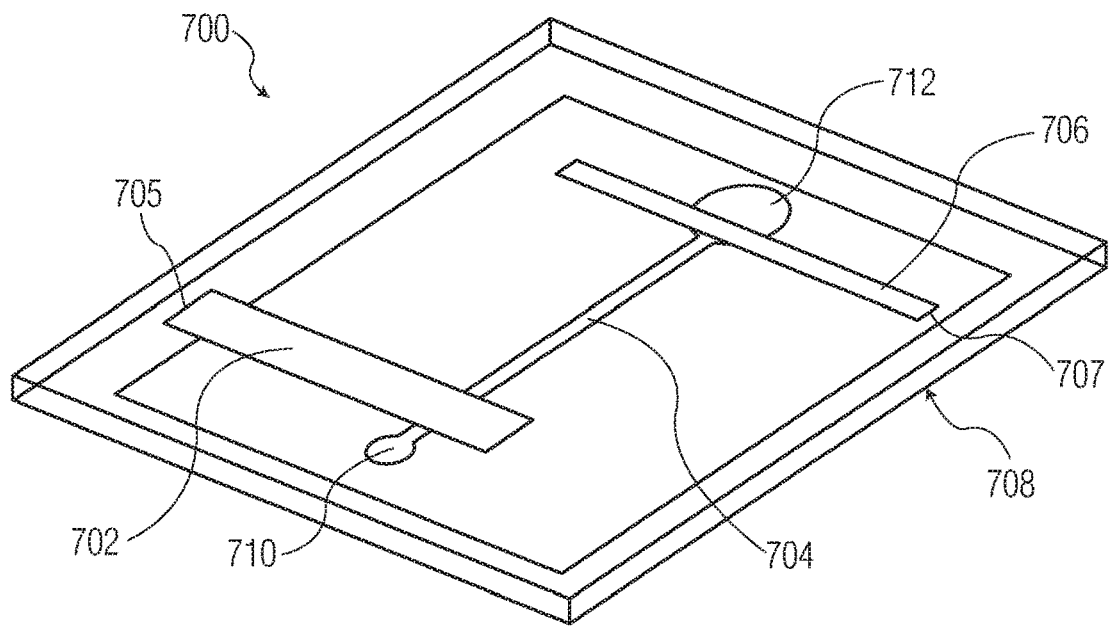
Figure 8:
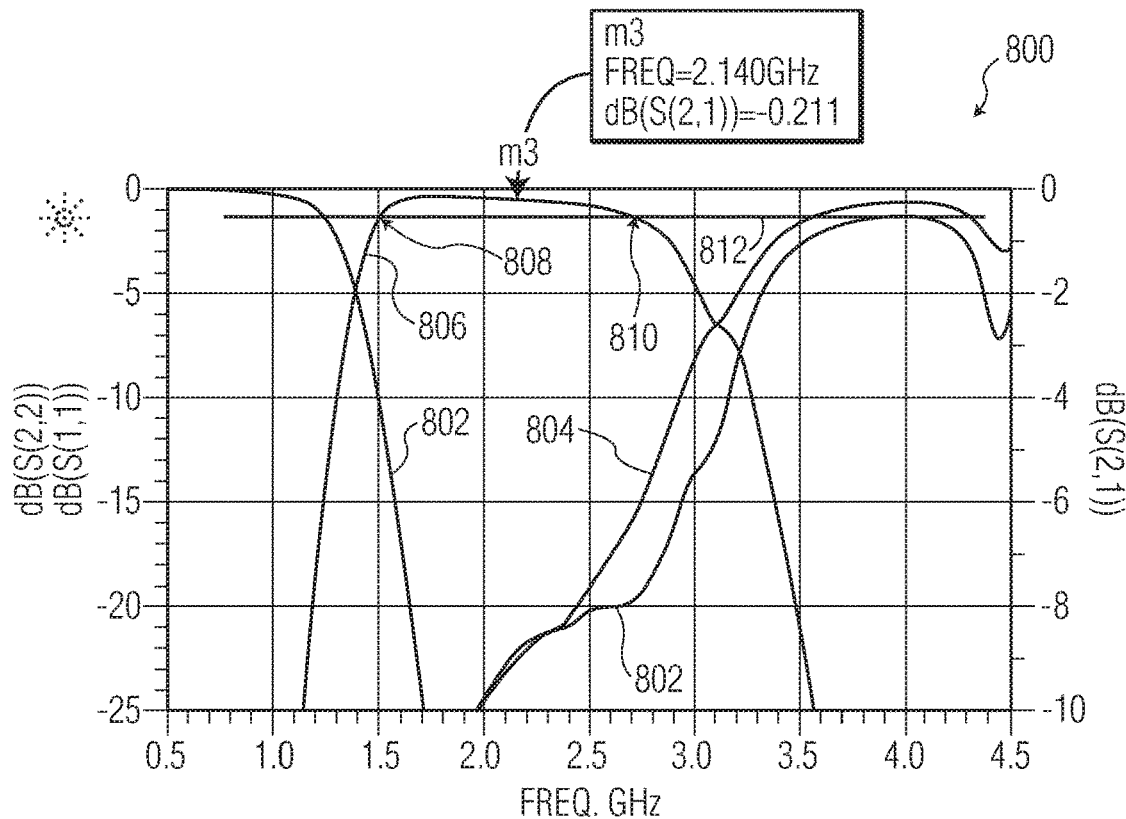

FIG. 5 is a schematic diagram showing a further improved Doherty amplifier circuit that is substantially the same as the Doherty amplifier circuit of FIG. 2 but that additionally includes a slotline inbuilt coupler that can serve as a slotline-coupled microstrip lines wideband (WB) directional coupler, in accordance with another example embodiment encompassed herein;

FIG. 6 provides a top plan view of an example slotline inbuilt coupler that is similar to that implemented in the Doherty amplifier circuit of FIG. 5, and that is intended to illustrate aspects of an alternate example arrangement of such a slotline inbuilt coupler;

FIG. 7 is a perspective view of an additional power combiner section that can be employed in place of the power combiner sections of FIGS. 2 and 3 in an additional improved Doherty amplifier circuit, in accordance with an additional example embodiment encompassed herein; and FIG. 8 is a graph showing example simulated insertion and input return losses associated with the power combiner section of FIG. 7.

DETAILED DESCRIPTION

The present disclosure encompasses a variety of embodiments of systems and methods in which a slotline formation is provided so as to couple other structures or coupling components such as microstrip transmission lines or coaxial cables. In at least some such embodiments, the slotline formation serves as a quarter wavelength slotline impedance transformer. Further, in at least some such embodiments, the slotline formation provides galvanic load isolation of an output port or load from a direct current (DC) drain power supply such that DC blocking capacitors need not be employed to provide such isolation (or to serve other purpose(s)). Avoidance of the use of such DC blocking capacitors can enhance the performance of the overall system of which the slotline formation forms a part, e.g., can enhance the performance of a Doherty power amplifier of which the slotline formation forms a part. Further, through the use of such a slotline formation, it is possible in one or more embodiments to achieve any one or more of wider radio frequency (RF) and video bandwidth, lower baseband drain impedance, suppressed low frequency gain, filtering out of harmonics (for example, second and third harmonics), higher reliability, higher production yield, and/or lower Bill of Materials (BOM) cost.

Referring to FIG. 2, an example improved two-way Doherty amplifier circuit 200 in accordance with one embodiment encompassed herein is shown. The Doherty amplifier circuit 200 is a Doherty power amplifier circuit and includes a power combiner section 202, by which the Doherty amplifier circuit 200 is coupled to a load $R_L$ 204 (which can be, for example, 50 ohms). More particularly as shown, the Doherty amplifier circuit 200 includes a carrier amplifier circuit section 206 and a peaking amplifier circuit section 208. The carrier amplifier circuit section 206 includes a transistor section 210 and an output matching section 212. The transistor section 210 may include, for example, a field effect transistor (FET), with a control terminal (e.g., gate), and two current conducting terminals (e.g., drain and source terminals). In FIG. 2, the drain terminal is coupled to the output matching section 212, and the source terminal is coupled to a ground node. In alternate embodiments, the transistor section 210 may include another type of transistor, such as a bipolar junction transistor (BJT), a high electron mobility transistor (HEMT), and so on. The usage, herein, of nomenclature typically used for FETs is not intended to be limiting. The output matching section 212 has a quarter wavelength DC feeder line that is coupled to a drain power supply voltage $V_{DS}$ 230, and also is coupled to the power combiner section 202. The output matching section 212 additionally is coupled to ground by way of each of a radio frequency (RF) capacitor $C_{RF}$ 216, which serves to terminate RF frequencies, and a low frequency capacitor $C_{LF}$ 218, which is for baseband frequencies termination.

Similarly, the peaking amplifier circuit section 208 includes a transistor section 220 (e.g., a FET or other type of transistor) and an output matching section 222. The output matching section 222 has a quarter wavelength DC feeder line that is coupled to the drain power supply voltage $V_{DS}$ 230, and also is coupled to the power combiner section 202. The output matching section 222 additionally is coupled to ground by way of each of a RF capacitor $C_{RF}$ 226, which serves to terminate RF frequencies, and a low frequency capacitor $C_{LF}$ 228, which is for baseband frequencies termination. Each of the output matching section 212 and the output matching section 222 can take the form of a microstrip transmission line.

Figure 1:
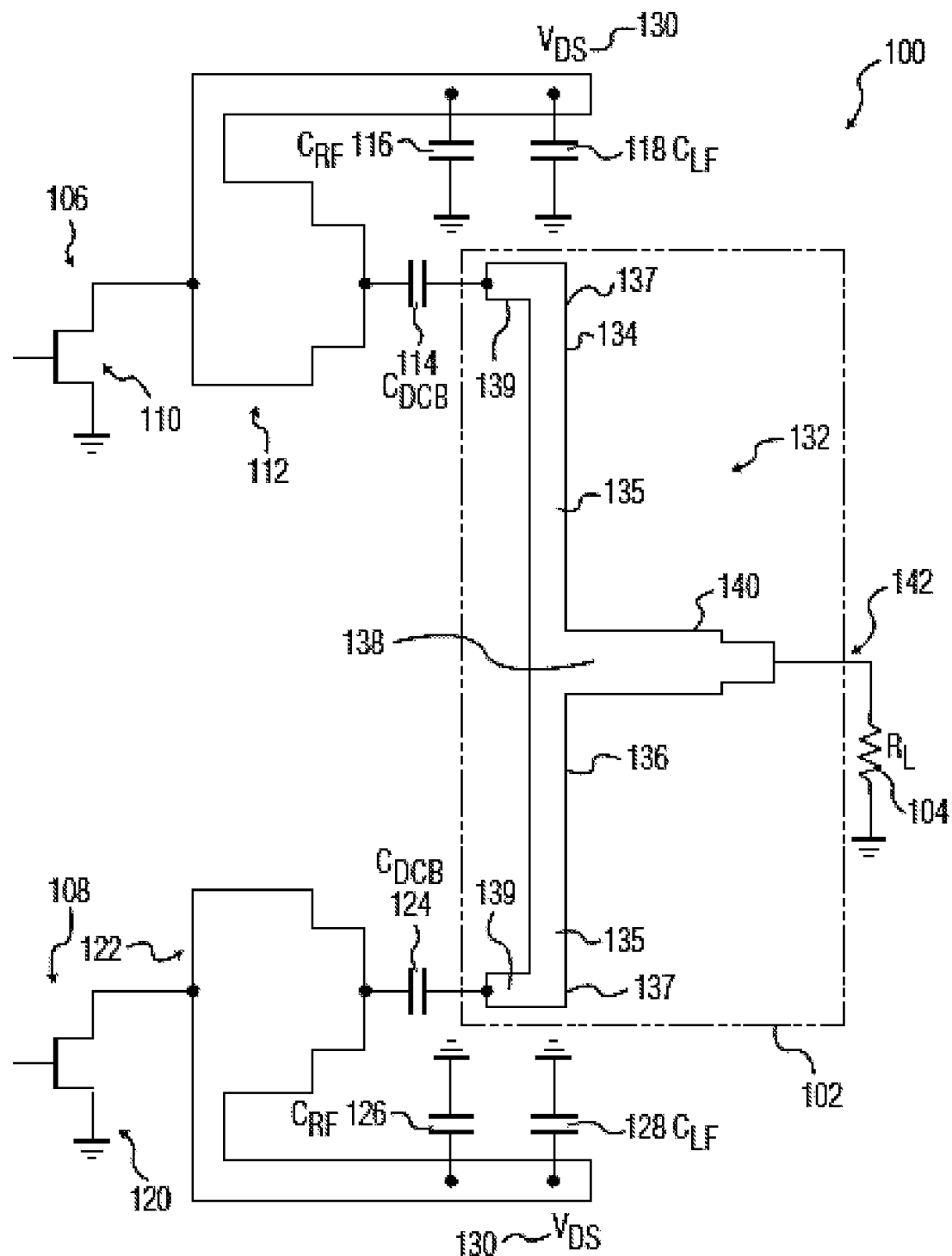
FIG. 1 is a schematic diagram showing a conventional Doherty amplifier circuit.

It will be appreciated that the Doherty amplifier circuit 200 of FIG. 2 shares a number of components that can be (but need not be) identical to, or substantially the same as, components of the conventional Doherty amplifier circuit 100 of FIG. 1. In particular, each of the carrier amplifier circuit section 206, the transistor section 210, the output matching section 212, the RF capacitor $C_{RF}$ 216, the low frequency capacitor $C_{LF}$ 218, the peaking amplifier circuit section 208, the transistor section 220, the output matching section 222, the RF capacitor $C_{RF}$ 226, the low frequency capacitor $C_{LF}$ 228, and the drain power supply voltage $V_{DS}$ 230, can respectively be identical to, or substantially the same as, the carrier amplifier circuit section 106, the transistor section 110, the output matching section 112, the RF capacitor $C_{RF}$ 116, the low frequency capacitor $C_{LF}$ 118, the peaking amplifier circuit section 108, the transistor section 120, the output matching section 122, the RF capacitor $C_{RF}$ 126, the low frequency capacitor $C_{LF}$ 128, and the drain power supply voltage $V_{DS}$ 130, respectively. Also, the load $R_L$ 204 to which the Doherty amplifier circuit 200 is coupled can be (but need not be) identical or substantially the same as the load $R_L$ 104.

Notwithstanding these similarities between the Doherty amplifier circuit 200 and the Doherty amplifier circuit 100, there are several differences between the two circuits. In particular, as described in further detail below, the power combiner section 202 of the Doherty amplifier circuit 200 has different components from, and operates differently than, the power combiner section 102 of the Doherty amplifier circuit 100. Additionally, in contrast to the Doherty amplifier circuit 100, which includes the DC blocking capacitors $C_{DCB}$ 114 and 124 that respectively couple the output matching sections 112 and 122 to the power combiner section 102, the Doherty amplifier circuit 200 does not employ any such capacitors. Rather, the output matching section 212 of the Doherty amplifier circuit 200 is coupled to the power combiner section 202 by way of a short circuit coupler (e.g., a short microstrip line, a wire, or a conductive trace) 214 and the output matching section 222 of the Doherty amplifier circuit 200 is coupled to the power combiner section 202 by way of a short circuit coupler (e.g., a short microstrip line, a wire, or a conductive trace) 224. As will be described in further detail below, the particular features of the power combiner section 202 make it possible for the output matching sections 212 and 222 to be connected to the power combiner section without any need for DC blocking capacitors. As a result, one or more disadvantages that can arise in Doherty amplifier circuits such as the Doherty amplifier circuit 100 that employ such DC blocking capacitors can be alleviated or entirely eliminated from the Doherty amplifier circuit 200.

More particularly, as shown in FIG. 2 the power combiner section 202 includes a first microstrip transmission line 232, a slotline formation 234, and a second microstrip transmission line 236 to which the load $R_L$ 204 is coupled. As shown, the slotline formation 234 extends between and electromagnetically couples or links the first microstrip transmission line 232 with the second microstrip transmission line 236. In the present embodiment, the slotline formation 234 is a quarter wavelength slotline formation. That is, a length of the slotline formation 234 between the first microstrip transmission line 232 and the second microstrip transmission lines 236 is equal to, or substantially equal to, one-quarter of a wavelength that is associated with the power provided by/generated by the carrier amplifier circuit section 206 and the peaking amplifier circuit section 208, or one-quarter of a wavelength of the fundamental operational frequency of the amplifier 200. In various embodiments, the fundamental operational frequency of the amplifier 200 is in a range of about 800 megahertz to about 6 gigahertz, although the fundamental operational frequency may be lower or higher, as well. In other embodiments, the slotline formation 234 can have other lengths or characteristics including, for example, those described elsewhere herein.

The first microstrip transmission line 232 includes a combining node 238, a first branch 240, and a second branch 242, where the first branch and second branch respectively extend outward from one another and away from the combining node 238 to the short circuit coupler 214 and the short circuit coupler 224, respectively. The first branch 240 can be considered to form an impedance inverter, and the second branch 242 can be considered to form a peaking state off offset (or peaking offset line). It will be noticed that each of the first and second branches 240 and 242, in addition to having a respective main portion 244 that extends outward away from the combining node 238 up to a respective far end 246, also includes a respective bent portion 248 (or tab) extending perpendicularly from the respective far end 246 of the respective main portion 244, and it is the respective bent portions that are coupled to the short circuit coupler 214 and the short circuit coupler 224, respectively. As for the second microstrip transmission line 236, in the present embodiment that transmission line is L-shaped, with one leg of the transmission line being electromagnetically coupled to the slotline formation 234 and the other leg of the transmission line being the leg that is coupled (directly or indirectly) to the load $R_L$ 204.

It should be additionally appreciated that FIG. 2 is intended to be figuratively representative of a top plan view of the Doherty amplifier circuit 200. As illustrated, in the present embodiment, the slotline formation 234 extends beneath the first microstrip transmission line 232 and beneath the second microstrip transmission line 236. More particularly, the slotline formation 234 is an elongated, substantially-linear gap formed within a metal structure such as a first conductive layer of a printed circuit board (PCB) 250 of the power combiner section 202 (e.g., a conductive ground layer). More particularly, the slotline formation 234 includes a linear gap portion 252 extending between a first rounded end gap portion (or simply rounded end) 254 and a second rounded end gap portion (or simply rounded end) 256, and is formed as a region between a first interior sidewall 258 of the first conductive layer of the PCB 250, a second interior sidewall 260 of the first conductive layer of the PCB, a first rounded interior endwall 262 of the first conductive layer of the PCB, and a second rounded interior endwall 264 of the first conductive layer of the PCB.

By contrast, the first and second microstrip transmission lines 232 and 236 are metallic strips that are formed from portions of a second conductive layer of the PCB 250 located above/on top of the first conductive layer of the PCB 250 so that the transmission lines pass across the slotline formation 234. It should be appreciated that there is no galvanic coupling (or coupling by which electrical current can be communicated) between either of the microstrip transmission lines 232, 236 and the slotline formation 234, or between the first and second microstrip transmission lines themselves, e.g., because of an isolation material layer of the PCB between the first and second conductive layers of the PCB that include the microstrip transmission lines 232, 236 and the slot line formation 234, or because of physical spaces between the microstrip transmission lines and the PCB/slotline formation. Nevertheless, the first and second microstrip transmission lines 232, 236 are electromagnetically coupled to the slotline formation 234, and accordingly the microstrip transmission lines are electromagnetically coupled with one another through the slotline formation 234.

Notwithstanding the above description, the present disclosure is intended to encompass numerous other types of arrangements as well. For example, in alternate embodiments, the overall Doherty amplifier circuit 200 can be constructed by way of PCB structures having two layers or multiple layers of PCBs, where the slotline formation 234 is formed within one of the conductive PCB layers, such as within a bottom conductive ground layer of a two-layer PCB structure or within a conductive ground layer of a multi-layer PCB structure. The other components of the power combiner section 202, such as the first and second microstrip transmission lines 232 and 236 (which can serve as input/output microstrip transmission lines) and transistor impedance matching networks can be formed in other conductive layer(s) of the PCB structures than the one within which the slotline formation 234 is formed.

In the present embodiment shown in FIG. 2, the slotline formation 234 extends beyond the region bounded by the first and second microstrip transmission lines 232 and 236, and particularly the first and second rounded end gap portions 254 and 256, respectively are positioned beyond the first and second microstrip transmission lines 232 and 236, respectively. It will be appreciated that the rounded end gap portions 254, 256 are sized and shaped so as to achieve desired tuning or coupling. As described further below, such rounded end gap portions need not be present in other embodiments, and indeed it is not necessary in all embodiments for the slotline formation to extend beyond the microstrip transmission lines 232 and 236.

Further with respect to the embodiment of FIG. 2, the slotline formation 234 particularly is a quarter wavelength transmission line (or transmission line segment) that serves as a slotline impedance transformer and serves to provide galvanic isolation of the load $R_L$ 204 relative to the carrier and peaking amplifier circuit sections 206 and 208. By virtue of the slotline formation 234, harmonic coupling between the first and second microstrip transmission lines 232, 236—and thus between the load and the voltage applied to the drains of the transistors of the carrier and peaking amplifier circuits (e.g., the drain power supply voltage $V_{DS}$ 230)—is avoided. Likewise by virtue of the slotline formation 234, DC isolation between the first and second microstrip transmission lines 232, 236, and thus between the load and the drain voltage, is provided. It should be appreciated that slotline formations such as the slotline formation 234 operate as transmission lines in accordance with known slot transmission line theory.

The exact physical dimensions and characteristics, and the exact electromagnetic properties, of the microstrip transmission lines 232, 236 and slotline formation 234 can vary depending upon the particular embodiment or intended or anticipated application(s). Particular features of the first and second microstrip transmission lines 232 and 236 and the slotline formation 234 of the Doherty amplifier circuit 200 of FIG. 2, or of other arrangements of microstrip transmission lines and slotline formations in other embodiments, which are appropriate for achieving desired microstrip to slotline transitions, can be determined in accordance with advanced design techniques. According to some embodiments, the slotline formation 234 has a width (e.g., the dimension between the sidewalls 258, 260) in a range of about 20 mil to about 80 mil depending upon system impedance and PCB material, and a length (e.g., the dimension between the gap portions 254, 256) in a range of about 500 mil to about 2000 mil depending upon operational frequency and PCB material, although the width, and/or length may be outside of this range, as well. Further, according to some embodiments, the thickness of the isolation material layer of the PCB between the first and second conductive layers of the PCB that include the microstrip transmission lines 232, 236 and the slotline formation 234 is in a range of about 5 mil to about 60 mil, and the dielectric constant of the isolation material layer of the PCB is in a range of about 3 to about 10.

In the present example, embodiment, in which the Doherty amplifier circuit 200 is a symmetric Doherty amplifier, the impedance inverter characteristic impedance (Zinv) of the impedance inverter provided by the first branch 240 can be Zo (that is, Zinv=Zo), and likewise the peaking offset line characteristic impedance (Zst.off) of the peaking offset line provided by the second branch 242 can be Zo (that is, Zst.off=Zo). Given this to be the case, the combining node impedance Zcn at the combining node 238 can be calculated as:

$$Zcn = \frac{Zinv * Zst.off}{Zinv + Zst.off} = \frac{Zo}{2}. \quad (1)$$

Additionally, to match the combining node impedance to the output load $R_L$ 204, the characteristic impedance Zsl of the quarter wavelength slotline provided by the slotline formation 234 should be:

$$Zsl = \sqrt{Zcn * Rl} \quad (2).$$

where Rl is a load impedance, for example 50 Ohm. According to some embodiments, the slotline formation 234 has a characteristic impedance in a range of about 20 Ohm to about 50 Ohm, although the characteristic impedance may be lower or higher, as well.

The Doherty amplifier circuit 200 of FIG. 2 employing the power combiner section 202 with the slotline formation 234 may be advantageous in one or more respects relative to conventional Doherty amplifier circuits such as the Doherty amplifier circuit 100 of FIG. 1. For example, the galvanic isolation properties of the microstrip to slotline transition achieved by the interaction of the microstrip transmission line 232 and the slotline formation 234 (and possibly the interaction of the microstrip transmission line 236 and the slotline formation 234 as well) may allow for the elimination of output DC blocking capacitors such as the DC blocking capacitors $C_{DCB}$ 114 and 124 of FIG. 1. Consequently, the Doherty amplifier circuit 200 with the slotline formation 234 may experience improved RF bandwidth relative to conventional Doherty amplifier circuits such as the Doherty amplifier circuit 100 because the broadband performance of transmission lines is much better by comparison with multilayer RF capacitors. Additionally, there may be little or no insertion loss sacrifice by using a slot transmission line such as the slotline formation 234 instead of microstrip line.

Additionally, the Doherty amplifier circuit 200 may experience lower drain impedance at baseband by comparison with conventional Doherty amplifier circuits such as the Doherty amplifier circuit 100, and this lower drain impedance may allow for improved instantaneous bandwidth and facilitates Digital Pre-Distortion (DPD) linearization. Further, by eliminating the multilayer DC blocking RF capacitors (again, for example, the capacitors 114 and 124), the Doherty amplifier circuit 200 may be better able to be operated at harsh temperature conditions. Further, there may be improved production yield due to lower performance variations, and potentially reduced Bill of Materials (BOM) cost, associated with Doherty amplifier circuits such as the Doherty amplifier circuit 200 in which the DC blocking capacitors are omitted by comparison with conventional Doherty amplifier circuits such as the Doherty amplifier circuit 100 in which those capacitors are present.

In view of one or more of the advantages provided by Doherty amplifier circuits such as the Doherty amplifier circuit 200, such Doherty amplifier circuits may be more effectively implemented in a variety of applications. For example, the use of such Doherty amplifier circuits may allow designers of wireless transmitters to cope with more stringent demands on system bandwidth, linearity, and versatility, and may allow such designers to better satisfy the demands of a wireless communications market that is continually seeking higher throughput and lower power consumption. Also, given that DC blocking (RF) capacitors isolate carrier and peaking amplifier drains at baseband envelope frequencies, Doherty amplifier circuits such as the Doherty amplifier circuit 200 that can operate without DC blocking capacitors also may be particularly advantageous as instantaneous bandwidth becomes an important parameter of modern base stations transmitters. Indeed, it should be appreciated that improved base station RF power amplifiers for wireless communication systems may be made possible through the use of Doherty amplifier circuits employing slotline formations as shown in FIG. 2 or as described otherwise herein.

It should additionally be appreciated that the power combiner section 202 of the Doherty amplifier circuit 200 has drains that are DC connected and has two drain feeders that are connected in parallel by the output matching sections (or networks) 212, 222, the impedance inverter provided by the first branch 240, and the peaking state off offset (or peaking offset line) provided by the second branch 242. This arrangement may allow for a reduction in the parasitic inductance of each feeder relative to that found in conventional Doherty amplifier circuits such as the Doherty amplifier circuit 100. Therefore, in the Doherty amplifier circuit 200, by virtue of the slotline formation 234, the baseband resonance frequency may be shifted almost by $\sqrt{2}$ and thus increased. The exact amount of this shift/increase will depend upon the impedance inverter and peaking state off offset/peaking offset line characteristic impedance—generally, as the line becomes wider, the parasitic inductance becomes lower. Additionally, in the Doherty amplifier circuit 200, by virtue of the slotline formation 234, the baseband drain impedance may be reduced, which may increase the instantaneous bandwidth and facilitate a DPD correction. Such DPD correction may allow for reductions in undesired emissions (or reductions in the ratios of undesired emissions close to the carrier or relative to desired emissions), which are increasingly sought or required by the Federal Communication Commission (FCC) so as to achieve reductions in interference.

Notwithstanding the embodiment shown in FIG. 2, the present disclosure is intended to encompass numerous other embodiments. For example, even though the Doherty amplifier circuit 200 involves a two-way symmetric Doherty structure and a 50 Ohm characteristic impedance, these features are merely examples. In other embodiments encompassed herein, for example, there are three-way Doherty structures (e.g., Doherty amplifier circuits with three amplifier circuit sections) or n-way Doherty structures (e.g., Doherty amplifier circuits with any arbitrary number n>1 of amplifier circuit sections) with different characteristic impedances and different peaking to carrier power ratios. Additionally for example, the physical features of the microstrip transmission lines and slotline formations (and possibly other components) of the power combiner section can vary depending upon the embodiment.

More particularly, with respect to FIG. 3, an alternate embodiment of a power combiner section 302 is shown. In this embodiment, the power combiner section 302 includes the first microstrip transmission line 232 of the power combiner section 202 that is shown in FIG. 2, including the combining node 238, the first branch 240 (forming the impedance inverter), and the second branch 242 (forming the peaking state off offset), and can be coupled by way of the short circuit coupler 214 and the short circuit coupler 224 to a carrier amplifier circuit section and a peaking amplifier circuit section as discussed above in regard to FIG. 2. However, in contrast to the power combiner section 202, the power combiner section 302 includes a dogleg-shaped slotline formation 304 and a diagonal inwardly-extending second microstrip transmission line 306, respectively, instead of the slotline formation 234 and the second microstrip transmission line 236, respectively. Similar to the embodiment of FIG. 2, the load $R_L$ 204 is coupled to the second microstrip transmission line 306, albeit in other embodiments other loads can be coupled to that transmission line.

More particularly as shown, the diagonal inwardly-extending second microstrip transmission line 306 has a first end 308 to which the load $R_L$ 204 is coupled, and extends inwardly (toward the first microstrip transmission line 232) in a diagonal manner away from that first end to a second rounded end 310, across the dogleg-shaped slotline formation 304. Additionally, the dogleg-shaped slotline formation 304 extends between the first microstrip transmission line 232 and the second microstrip transmission line 306 and further extends beyond those transmission lines, from a first sector-shaped end portion 312 extending outward (relative to a portion of the slotline formation positioned between the two transmission lines) just beyond the first microstrip transmission line 232 to a second sector-shaped end portion 314 extending outward just beyond (again relative to a portion of the slotline formation positioned between the two transmission lines) the second microstrip transmission line 306. The sector-shaped end portions 312, 314 particularly illustrate examples of ends of the slotline formation having a different form than the rounded end portions 254, 256 described in regard to FIG. 2. Further as shown, in this embodiment, although the slotline formation 304 generally extends linearly between the first and second microstrip transmission lines 232 and 306, as the slotline formation 304 passes beneath the second microstrip transmission line, it jogs diagonally so as to pass substantially perpendicularly beneath the diagonal inwardly-extending second microstrip transmission line, such that the slotline formation is "dog-legged."

Figure 4:
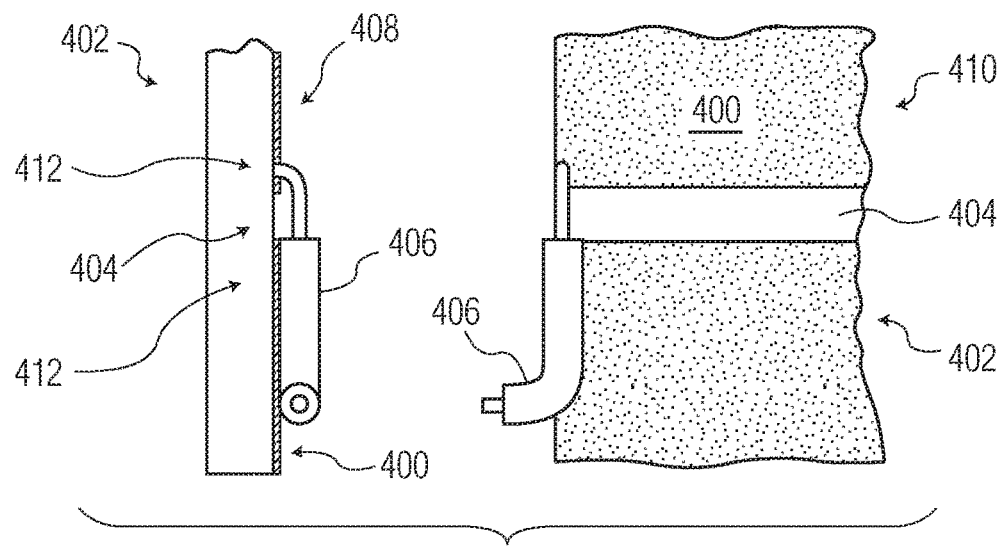
FIG. 4 shows an end view and a cutaway top elevation view of a power combiner section that can be employed in place of the power combiner sections of FIG. 2 and FIG. 3 in a further improved Doherty amplifier circuit, in accordance with a further example embodiment encompassed herein.

Although in the embodiments of FIGS. 2 and 3, the power combiner sections 202 and 302 respectively employ the second microstrip transmission lines 236 and 306 respectively to couple electromagnetically the respective slotline formations 234 and 304 to the load (e.g., the load $R_L$ 204), in other embodiments other arrangements can be employed in place of a slotline-to-microstrip line transition. For example, referring to FIG. 4, depicting a cross-sectional end view 408 and a cutaway top view 410 of a portion of a power combiner, in one alternate embodiment encompassed herein, a power combiner section 402 employs, in addition to a slotline formation 404 formed within a first conductive layer of a PCB 400, a coaxial cable (or coaxial connector) 406 to which a load (e.g., the load $R_L$ 204) can be coupled (not shown). In this arrangement, the coaxial cable 406 takes the place of a second transmission line, such as either of the transmission lines 236 or 306, as the component linking the slotline formation 404 with the load. More particularly, the slotline formation 404 is ended on open space. Additionally, the inner (center) conductor of the coaxial cable 406 is connected to one side of the slotline formation 404 but the outer conductor is connected to the opposite side of the slotline formation. The coaxial cable 406 is attached to the bottom ground layer of PCB, and the characteristic impedance of the coaxial cable corresponds to the characteristic impedance of the slotline formation 404.

For purposes of this example, it should be understood that the power combiner section 402 includes the first microstrip transmission line 232, that the slotline formation 404 extends beneath the first microstrip transmission line in a manner identical to either that of FIG. 2 or FIG. 3, and that the power combiner section 402 interfaces with other components of a Doherty amplifier circuit (e.g., the carrier and peaking amplifier circuit sections 206 and 208) by way of short circuit couplers such as the couplers 214, 224 discussed above in regard to FIGS. 2 and 3. The slotline formation 404 extends between the first microstrip transmission line and the coaxial cable 406 so as to electromagnetically couple that transmission line and coaxial cable, such that electromagnetic signals can pass between that transmission line and coaxial cable.

More particularly, it should be appreciated that FIG. 4 includes both a cross-sectional end view 408 of the power combiner section 402 (which can also be considered an end view of a portion of an overall Doherty amplifier circuit of which the power combiner section forms a part) and a cutaway top elevation view 410 of the power combiner section (or the overall Doherty amplifier circuit of which that power combiner section forms a part). As visible particularly in the end view 408, the coaxial cable 406 can be attached to the PCB 400 by way of solder or conductive epoxy (or possibly in another manner) adjacent or proximate to the slotline formation 404, particularly adjacent or proximate to the end of the slotline formation that is opposite the end which is proximate the first microstrip transmission line (not shown). As illustrated, the attachment can occur at locations 412 on opposite sides of the slotline formation 404. By virtue of the attachment of the coaxial cable 406 in this manner, direct slotline-to-coax (or slotline-to-coaxial connector) electromagnetic coupling is achieved between the slotline formation 404 and the coaxial cable 406, and thus communication between the slotline formation 404 and the load that is coupled to the coaxial cable is achieved.

In at least some embodiments encompassed herein, electromagnetic signals communicated via a slotline formation such as (but not limited to) any of the slotline formations 234, 304, 404 described herein are not only coupled to a load via a microstrip transmission line or coaxial cable (or other coupling mechanism) as discussed above, but also can be utilized to provide DPD system feedback signals. For example, referring to FIG. 5, a further improved Doherty amplifier circuit 500 is shown that is substantially the same as the Doherty amplifier circuit 200 of FIG. 2 except insofar as the Doherty amplifier circuit 500 additionally includes a slotline inbuilt coupler 510.

More particularly, it should be appreciated by a comparison of FIG. 5 and FIG. 2 that the Doherty amplifier circuit 500 particularly includes the carrier amplifier circuit section 206 and peaking amplifier circuit section 208 of the Doherty amplifier circuit 200 of FIG. 2, and also that a power combiner section 502 links those amplifier circuit sections with the output load $R_L$ 204 of FIG. 2. Also, in this embodiment of FIG. 5, nearly all of the components of the power combiner section 502 are identical to those of the power combiner section 202 (including, for example, the first and second microstrip transmission lines 232 and 236). However, in contrast to the power combiner section 202, the power combiner section 502 has an additional microstrip line 506 that overlays a slotline formation 504 that takes the place of the slotline formation 234 described above. The additional microstrip line 506 and slotline formation 504 together form a structure that allows for electromagnetic coupling therebetween, as described further in regard to FIG. 6 below, and that can be understood to constitute the slotline inbuilt coupler 510. Further as shown, the additional microstrip line 506 extends in a generally S-shaped manner between a first end 508 and a second end 514 of the additional microstrip line 506. The first end 508 of the additional microstrip line 506 is coupled to ground by way of a resistor 512 (which has, in this example, a 50 Ohm resistance), and the second end 514 of the additional microstrip line can be coupled to an external device or circuit (not shown) that is configured to receive DPD feedback signals that are communicated via the additional microstrip line 506 due to its being electromagnetically coupled with the slotline formation 504.

It will be observed from FIG. 5 that, in the embodiment shown therein, the slotline formation 504 is shown to be straight and the additional microstrip line 506 is shown to follow a path that extends from a location below (when viewed as shown in FIG. 5) the slotline formation 504 to the slotline formation, then curves rightward so as pass along a portion of the slotline formation 504, and then ultimately curves upward to a further location above the slotline formation 504. Notwithstanding the particular features of the embodiment shown in FIG. 5, however, it should be appreciated that a slotline inbuilt coupler can take any of a variety of forms depending upon the embodiment. Further in this regard, for example, FIG. 6 shows a top plan view of an example slotline inbuilt coupler 600 that is similar to that implemented in the Doherty amplifier circuit of FIG. 5, and that is intended to illustrate aspects of an alternate example arrangement of such a slotline inbuilt coupler. More particularly as shown, the slotline inbuilt coupler 600 includes a microstrip transmission line 602 that extends in a generally S-shaped manner between a first port (Port 1) 604 and a second port (Port 2) 606. Additionally, the slotline inbuilt coupler 600 also includes a slot transmission line (slotline) 608 that extends in a generally S-shaped manner between a third port (Port 3) 610 and a fourth port (Port 4) 612. Further, the slotline inbuilt coupler 600 additionally includes a circular formation 614.

Consistent with the discussion above concerning the slotline inbuilt coupler 510 of FIG. 5, the microstrip transmission line 602 and slotline 608 are not both positioned at a common conductive layer (e.g., at a shared level) on top of a PCB 616. Rather, the microstrip transmission line 602 overlays the slotline 608, such that the microstrip transmission line is positioned at a top (first) conductive layer 618 and the slotline is positioned at a bottom (second) conductive layer 620 beneath the top layer and within the PCB 616. Further, the PCB 616 includes a middle conductive layer 622 (or middle level) positioned between the first and second layers 618 and 620. The circular formation 614 is formed within the middle layer 622, and allows for electromagnetic signals to be communicated between the microstrip transmission line 602 and the slotline 608. In other words, the PCB 516 includes at least three conductive layers, where the slotline formation 614 is an opening in the center conductive layer.

With respect to the physical features of the microstrip transmission lines 602, the slotline 608, and the circular formation 614, in the present embodiment the microstrip transmission line 602 particularly includes a bulging, substantially-elliptical portion 624 that is positioned so as to overlap (and be aligned or substantially aligned with) the circular formation 614. Although not visible, it should be appreciated that the slotline 608 can include an identical or substantially similar bulging, substantially-elliptical portion that is directly beneath (and aligned or substantially aligned with) the substantially-elliptical portion 624. The substantially-elliptical portion 624 has a major axis 626 with a length $D_3$ extending parallel to (or substantially parallel to) the microstrip transmission line 602 proximate the location of the portion 624, and also has a minor axis 628 having a length $D_1$ extending perpendicularly (or substantially perpendicularly) to the microstrip transmission line 602 proximate the location of the portion 624. By contrast, a diameter $D_2$ of the circular formation 614 is substantially greater than the length $D_1$ of the minor axis 628, but substantially equal to the length $D_3$ of the major axis 626. Although the above discussion assumes that the circular formation 614 is in fact circular with a diameter $D_2$, that formation 614 need not be exactly circular but rather also can have other shapes, including elliptical shapes.

It should be appreciated that the slotline inbuilt coupler 600 can operate as part of a power combiner section and, for example, can serve in the same role, or substantially the same role, as the slotline inbuilt coupler 510 of FIG. 5. It should additionally be appreciated that the first and second ports 604 and 606 associated with the microstrip transmission line 602 respectively can be viewed as corresponding to the first and second ends 508 and 514, respectively, of the additional microstrip line 506. Further, the third and fourth ports 610 and 612, respectively, of the slotline 608 can be viewed as corresponding to opposed ends of the slotline formation 504 that interface the microstrip transmission lines 232 and 236, respectively.

As is evident by a comparison of FIG. 6 with FIG. 5, the slotline inbuilt coupler 600 has a somewhat different physical arrangement than the slotline inbuilt coupler 510 of FIG. 5. In particular, although each of the slotline 608 and the microstrip transmission line 602 follows a S-shaped path in the slotline inbuilt coupler 600 of FIG. 6, it is only the additional microstrip line 506 (which is a microstrip transmission line that corresponds to the microstrip transmission line 602) that is curved in the slotline inbuilt coupler 510, with the slotline formation 504 (which is a slotline corresponding to the slotline 608) being straight. Nevertheless, in each of the slotline inbuilt couplers 510 and 600, electromagnetic coupling between the two neighboring lines is achieved—that is, electromagnetic coupling between the slotline formation 504 and the additional microstrip line 506 is achieved in the embodiment of FIG. 5, and likewise electromagnetic coupling between the slotline 608 and the microstrip transmission line 602 is achieved in the embodiment of FIG. 6. Thus, it should be appreciated that, depending upon the circumstances, slotline inbuilt couplers having any of these arrangements or any of a variety of other arrangements can be appropriate for implementation in Doherty amplifier circuits (or implementation in other circuits or systems).

Referring additionally to FIGS. 7 and 8, simulations have demonstrated that circuits employing slotline formations, such as the power combiner sections 202, 302, and 502 described herein, demonstrate enhanced performance relative to comparable circuits employing microstrip transmission lines in place of those slotline formations. For example, FIG. 7 provides a perspective view of a power combiner section 700 having a first microstrip transmission line 702, a second microstrip transmission line 706, and a slotline formation 704 in a conductive layer underlying the first and second microstrip transmission lines 702, 706, where the underlying conductive layer is separated from the first and second microstrip transmission lines 702, 706 by a dielectric material. A first port 705 is provided at an end of the first microstrip transmission line 702, and a second port 707 is shown to be provided at an end of the second microstrip transmission line 706.

Similar to the arrangements discussed in relation to FIGS. 2 and 3 herein, the slotline formation 704 is formed as an elongated gap within a conductive layer of a PCB 708 and extends between the first and second microstrip transmission lines 702, 706, each of which passes perpendicularly above and across the slotline formation. Also as shown, the slotline formation 704 extends outward beyond the first and second microstrip transmission lines 702 and 706, respectively, to a first rounded end gap portion 710 and a second rounded end gap portion 712, respectively. In this embodiment (and in contrast to the embodiment of FIG. 2, in which the rounded end gap portions 254, 256 of the slotline formation 234 are of equal size), the first rounded end gap portion 710 is smaller than the second rounded end gap portion 712, e.g., a diameter of the portion 710 is smaller than a diameter of the portion 712. It will be appreciated that the sizes of the rounded end gap portions 710, 712, which differ from the rounded end gap portions 254, 256 of FIG. 2, again are designed to achieve particular tuning or coupling levels for the power combiner section 700. More particularly, in the embodiment of FIG. 7, the rounded end gap portions 710 and 712 are formed to achieve a microstrip-slotline 20 to 50 ohm transformer structure.

Referring additionally to FIG. 8, a graph 800 is provided that shows simulated input return and insertion losses relative to frequency for the power combiner section 700 of FIG. 7 employing the slotline formation 704 linking the first and second transmission lines 702 and 706. In particular, first, second, and third curves 802, 804, and 806 are illustrated. The first curve 802 is the input return loss S(1,1) (in dB) for the power combiner section 700, that is, the input return loss looking inward to the power combiner section at the side of the first microstrip transmission line 702. The second curve 804 is the input return loss S(2,2) (in dB) for the power combiner section 700, that is, the input return loss looking inward to the power combiner section at the side of the second microstrip transmission line 706. The third curve 806 is the insertion loss S(2,1) (again in dB) for the power combiner section 700. As will be appreciated, the insertion losses are modest over an approximately 1.25 gigahertz (GHz) bandwidth between a first point 808 and a second point 810 at which the third curve 806 crosses a horizontal line 812, and is particularly modest (e.g., a value of –0.211 dB) at a central frequency of 2.140 GHz corresponding to a location m3 on the third curve 806.

It should be appreciated that the example embodiment of FIGS. 7 and 8 is useful and advantageous in various respects. Among other things, it should particularly be appreciated that the insertion losses of the power combiner section 700 as shown in FIG. 8 are comparable to conventional microstrip line structures that lack slotline formations (e.g., such as that of FIG. 1), particularly within the aforementioned 1.25 GHz bandwidth. At the same time, even though the same or comparable levels of losses are experienced in the power combiner section 700 relative to a same-dimension conventional power combiner section (of the form shown, for example, in FIG. 1) that only employs microstrip transmission lines, such a conventional power combiner section has a narrowing bandwidth due to the DC blocking capacitors that are implemented in relation to that power combiner section. By contrast, the power combiner section 700, and other power combiner sections with slotline formations encompassed herein such as those of FIGS. 2, 3, and 4 may not exhibit such a narrowing bandwidth. That is, embodiments with slotline formations such as that of FIGS. 7 and 8 (as well as FIGS. 2, 3, and 4) can achieve the same or substantially similar insertion loss levels as conventional power combiner sections lacking slotline formations, and at the same time be implemented in a manner that is without bandwidth degradation.

Also, it should be appreciated that the embodiment of FIG. 7 is a flexible design in the sense that it can be readily modified to achieve somewhat modified behavior. The example embodiment of FIG. 7, which has a bandwidth equal to microstrip line transition at –0.5 dB insertion loss level, is intended to be illustrative of the applicability of a wide variety of embodiments employing slotline formations linking microstrip transmission lines. For example, the structure of FIG. 7 can be improved in at least some embodiments, for example, by implementing other, differently-shaped radial stubs.

An additional important advantage of the arrangement of FIG. 7 is that it may achieve more than 6 decibel (dB)/500 megahertz (MHz) out of band insertion loss roll-off. Given this property, the power combiner section 700 may be capable of acting as an output filter to significantly reduce out of band gain (especially at low frequencies), out of band unwanted emission, and high order intermodulation products to facilitate DPD correction. Additionally, this slotline solution can be used for interstage filtering as well. Due to the sharp roll-off characteristics as a filter, rejection requirements to an output diplexer can be relaxed to reduce back-end frequency division duplexing (FDD) system loss and diplexer's size. Further, the low frequency (LF) resonance frequency may be increased up to √2 times due to DC connections of carrier and peaking output matching networks (each site will see at low frequency like "double Bias Feed"). Additionally, as already discussed above (e.g., in regard to the embodiment of FIG. 2), the embodiment of FIG. 7 need not be implemented in conjunction with two DC blocking capacitors. Such absence of DC blocking capacitors, particularly in the high temperature area at high power levels, may improve reliability/performance. Further, by avoiding the use of DC blocking capacitors, the BOM may be lowered, and this can reduce cost and improve manufacturability due to performance variation.

As already discussed above, the present disclosure is intended to encompass numerous embodiments in addition to those described herein in relation to any of FIGS. 2, 3, 4, 5, 6, and 7. For example, it is envisioned that numerous different embodiments can employ any of a variety of different types of slotline formations having any of a variety of configurations, sizes, and shapes, including end gap portions of different sizes and shapes. Although the several embodiments described above employ PCBs in which slotline formations are formed and multiple microstrip transmission lines are provided at layer(s) or level(s) above or below the slotline formations, the description of the microstrip transmission lines as being above or below the slotline formations is merely for convenience, and the microstrip transmission lines can also in other embodiments be positioned to the sides of the slotline formations, or be arranged in other different manners relative to the conductive layer in which the slotline formations are provided.

Also, as should be evident from FIGS. 2, 3, 4, 5, 6, and 7, the present disclosure is intended to encompass a variety of different embodiments and arrangements having any arbitrary number of layers, and/or having any of a variety of different types of input or output structures or components. For example, as already discussed above, in some embodiments a two-layer PCB is employed in which first and second conductive layers are separated by a dielectric layer, one or more microstrip transmission lines are formed in one of the conductive layers, and a slotline formation is provided in the other conductive layer. Also for example, in other embodiments, a multi-layer PCB having more than two conductive layers with dielectric layers positioned therebetween (e.g., a PCB with first, second, and third conductive layers, a first dielectric layer positioned between the first and second conductive layers, and a second dieletric layer positioned between the second and third conductive layers) can be employed. In such embodiments, a slotline formation can be provided in any one of the conductive layers (or possibly multiple slotline formations can be provided in one or more of the conductive layers). Further for example, it should be appreciated that, depending upon the embodiment, any of the embodiments of FIGS. 2, 3, 4, 5, 6, and 7 can be implemented (or modified to be implemented) on either a two-layer PCB or a multi-layer PCB.

Additionally for example, in one additional embodiment encompassed herein, a multi-layer module with a land grid array (LGA) pin out is provided (such an embodiment can employ an improved dissipation factor PCB material such as liquid crystal polymer (LCP)). Also for example, in another embodiment, an output connector can be installed in place of the second (output) port 707 of the second microstrip transmission line 706 of the embodiment of FIG. 7, with a central pin being connected to that microstrip transmission line. It should also be appreciated that it is possible to transfer RF power between layers in a multilayer PCB system. Such a "wireless via" arrangement can be advantageous in terms of providing a galvanically-isolated power transition. Further, it is also possible to use this type of approach to provide a flexible solution for input carrier/peaking phase alignment and as a power input splitter and output combiner for n-way Doherty power amplifier solutions, as well as to achieve interstage filtering and galvanically-isolated connections. Further still, the various embodiments described herein may be used in various types of power amplifiers with multiple amplifier paths other than Doherty power amplifiers. Additionally, although embodiments such as those presented in FIGS. 4, 5, and 6 include components or features such as the slotline inbuilt couplers 510, 600 and the coaxial cable 406, such components or features are optional and need not be present in all embodiments.

Additionally, at least some embodiments encompassed herein relate to a power amplifier system. The power amplifier system includes a first amplifier circuit having a first output terminal, a second amplifier circuit having a second output terminal, and a power combiner circuit. The power combiner circuit is coupled to each of the first and second amplifier circuits and has a first microstrip transmission line component, a slotline formation, and an additional coupling component that is capable of being at least indirectly coupled to a load. In such embodiment, first and second locations along the first microstrip transmission line component are respectively short-circuited to the first and second output terminals, and the slotline formation extends between a first position proximate the first microstrip transmission line component and a second position proximate the additional coupling component. Additionally, the first microstrip transmission line component and additional coupling component are electromagnetically coupled by way of the slotline formation.

Further, in at least some embodiments encompassed herein, a system includes a first circuit portion configured to provide a first RF signal having a wavelength associated therewith, and a second circuit portion configured to provide a second RF signal also having the wavelength associated therewith. Additionally, the system also includes a first microstrip transmission line having a first port and a second port, where the first port is directly coupled to the first circuit portion and the second port is directly coupled to the second circuit portion. Further, the system additionally includes a second microstrip transmission line having a third port, and a slotline formation extending between a first position proximate the first microstrip transmission line and a second position proximate the second microstrip transmission line, where the slotline formation has a length that is substantially equal to a quarter of the wavelength. Additionally, the third port is configured to be in communication with a load and to provide thereto a third RF signal based at least indirectly upon the first and second RF signals, and the first and second circuit portions are galvanically isolated from the third port.

Additionally, at least some embodiments encompassed herein relate to a method of communicating at least some power generated at a power amplifier to a load. The method includes generating a first portion of the power at a first transistor circuit of the power amplifier, and generating a second portion of the power at a second transistor circuit of the power amplifier. The method also includes communicating the first portion of the power by way of a first short-circuited connection to a first port of a first microstrip transmission line, and communicating the second portion of the power by way of a second short-circuited connection to a second port of the first microstrip transmission line. The method further includes communicating a third portion of the power equaling or substantially equaling a sum of the first portion and second portion from the first microstrip transmission line to a second microstrip transmission line by way of a slotline formation electromagnetically coupling and galvanically isolating the first microstrip transmission line relative to the second microstrip transmission line. The third portion of the power is further output at a third port of the second microstrip transmission line so that the at least some of the third portion of the power can be communicated from the third port to the load.

While the principles of the invention have been described above in connection with specific apparatus, it is to be clearly understood that this description is made only by way of example and not as a limitation on the scope of the invention. It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A power amplifier system comprising:
a first amplifier circuit having a first output terminal;
a second amplifier circuit having a second output terminal; and
a power combiner circuit coupled to each of the first and second amplifier circuits and having a first microstrip transmission line component, a slotline formation, and an additional coupling component that is capable of being at least indirectly coupled to a load,
wherein first and second ends of the first microstrip transmission line component are respectively coupled to the first and second output terminals; and
wherein the slotline formation extends between a first position proximate a combining node between the first and second ends of the first microstrip transmission line component and a second position proximate the additional coupling component; and
wherein the first microstrip transmission line component and the additional coupling component each are electromagnetically coupled to the slotline formation.

2. The power amplifier system of claim 1, wherein the additional coupling component includes a second microstrip transmission line component.

3. The power amplifier system of claim 2, further comprising a printed circuit board (PCB), wherein the slotline formation is formed as a gap in a conductive layer of the PCB.

4. The power amplifier system of claim 3, wherein the gap extends in a substantially linear manner between the first and second positions.

5. The power amplifier system of claim 4, wherein the gap includes a first rounded end portion at a first end of the slotline formation adjacent to the first position and a second rounded end portion at a second end of the slotline formation adjacent to the second position.

6. The power amplifier system of claim 5, wherein a first diameter of the first rounded end portion is substantially smaller than a second diameter of the second rounded end portion.

7. The power amplifier system of claim 4, wherein the gap includes a first sector-shaped end portion at a first end of the slotline formation adjacent to the first position and a second sector-shaped end portion at a second end of the slotline formation adjacent to the second position.

8. The power amplifier system of claim 4, wherein the first microstrip transmission line component passes in a substantially perpendicular manner across a first region of the slotline formation and the second microstrip transmission line component passes in a substantially perpendicular manner across a second region of the slotline formation.

9. The power amplifier system of claim 8, wherein the gap, despite extending in a substantially linear manner, nevertheless also is doglegged so as to include a first segment extending diagonally relative to a second segment, and wherein the second region is within the first segment and the second microstrip transmission line component includes a diagonally-extending portion that passes in the substantially perpendicular manner across the second region within the first segment.

10. The power amplifier system of claim 1, wherein the additional coupling component includes a coaxial cable.

11. The power amplifier system of claim 1, wherein the first amplifier circuit is a carrier amplifier circuit of a Doherty amplifier, and the second amplifier circuit is a peaking amplifier circuit of the Doherty amplifier.

12. The power amplifier system of claim 1, wherein the slotline formation extends within a first conductive layer of a printed circuit board (PCB), and wherein the first microstrip transmission line component extends within a second conductive layer of the PCB.

13. The power amplifier system of claim 12, wherein the additional coupling component is a second microstrip transmission line component that either extends within the second conductive layer or extends within a third conductive layer.

14. The power amplifier system of claim 13, wherein the second microstrip transmission line extends within the third conductive layer, wherein the second conductive layer is separated from a first side of the first conductive layer by a first dielectric layer, and wherein the third conductive layer is separated from a second side of the first conductive layer by a second dielectric layer.

15. The power amplifier system of claim 14, wherein the power combiner circuit includes a slotline inbuilt coupler that operates at least in part as a wideband directional coupler.

16. A power amplifier system comprising:
a first amplifier circuit having a first output terminal;
a second amplifier circuit having a second output terminal; and
a power combiner circuit coupled to each of the first and second amplifier circuits and having a first microstrip transmission line component, a slotline formation, and an additional coupling component that is capable of being at least indirectly coupled to a load,
wherein first and second locations along the first microstrip transmission line component are respectively short-circuited to the first and second output terminals; and
wherein the slotline formation extends between a first position proximate the first microstrip transmission line component and a second position proximate the additional coupling component;
wherein the first microstrip transmission line component and additional coupling component are electromagnetically coupled to the slotline formation; and
wherein the slotline formation extends within a first conductive layer of a printed circuit board, PCB, wherein:
the first microstrip transmission line component extends within a second conductive layer of the PCB;

the additional coupling component is a second microstrip transmission line component that either extends within the second conductive layer or extends within a third conductive layer; and the second microstrip transmission line component extends within the third conductive layer, the second conductive layer being separated from a first side of the first conductive layer by a first dielectric layer and the third conductive layer being separated from a second side of the first conductive layer by a second dielectric layer.

17. The power amplifier system of claim 16, wherein the power combiner circuit includes a slotline inbuilt coupler that operates at least in part as a wideband directional coupler.

18. A power amplifier system comprising:
a first amplifier circuit having a first output terminal;
a second amplifier circuit having a second output terminal; and
a power combiner circuit coupled to each of the first and second amplifier circuits and having a first microstrip transmission line component, a slotline formation, and an additional coupling component that is capable of being at least indirectly coupled to a load,
wherein first and second locations along the first microstrip transmission line component are respectively short-circuited to the first and second output terminals; and
wherein the slotline formation extends between a first position proximate the first microstrip transmission line component and a second position proximate the additional coupling component;
wherein the first microstrip transmission line component and additional coupling component are electromagnetically coupled to the slotline formation;
wherein a further position, at or proximate to which the first microstrip transmission line component crosses the slotline formation, is a combining node, wherein a combining node impedance associated with the combining node is matched to a load impedance of the load, wherein the slotline formation serves as a quarter wave slotline, and wherein the additional coupling component is galvanically isolated from the first microstrip transmission line component.

19. A system comprising:
a first circuit portion configured to provide a first RF signal having a wavelength associated therewith;
a second circuit portion configured to provide a second RF signal also having the wavelength associated therewith;
a first microstrip transmission line having a first port and a second port, wherein the first port is directly coupled to the first circuit portion and the second port is directly coupled to the second circuit portion;
a second microstrip transmission line having a third port;
a slotline formation extending between a first position proximate the first microstrip transmission line and a second position proximate the second microstrip transmission line,
wherein the slotline formation has a length that is substantially equal to a quarter of the wavelength,
wherein the third port is configured to be in communication with a load and to provide thereto a third RF signal based at least indirectly upon the first and second RF signals; and
wherein the first and second circuit portions are galvanically isolated from the third port.

20. The system of claim 19, further comprising a third microstrip transmission line that is electromagnetically coupled with the slotline formation and by which a digital pre-distortion feedback signal can be provided.

* * * * *